United States Patent
Berkcan

(10) Patent No.: US 7,307,540 B2
(45) Date of Patent: Dec. 11, 2007

(54) SYSTEMS, APPARATUS, AND METHODS HAVING A MECHANICAL LOGIC FUNCTION IN A MICROELECTROMECHANICAL SYSTEM SENSOR

(75) Inventor: Ertugrul Berkcan, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 361 days.

(21) Appl. No.: 10/863,376

(22) Filed: Jun. 8, 2004

(65) Prior Publication Data

US 2005/0270166 A1    Dec. 8, 2005

(51) Int. Cl.
*G08B 21/00* (2006.01)
(52) U.S. Cl. .............. 340/665; 340/664; 340/10.41
(58) Field of Classification Search ............... 340/665, 340/686.1, 664, 10.41, 635; 360/69
See application file for complete search history.

(56) References Cited

U.S. PATENT DOCUMENTS

| | | | |
|---|---|---|---|
| 4,399,440 A * | 8/1983 | Douglas ................. 340/870.26 |
| 4,733,561 A * | 3/1988 | Gilby .......................... 73/579 |
| 5,296,750 A * | 3/1994 | Bozeman, Jr. ............. 327/516 |
| 5,710,648 A * | 1/1998 | Frigo ......................... 398/108 |
| 6,188,322 B1 * | 2/2001 | Yao et al. .................... 340/664 |
| 6,411,214 B1 * | 6/2002 | Yao et al. .................... 340/664 |
| 6,617,963 B1 * | 9/2003 | Watters et al. ........... 340/10.41 |
| 6,785,111 B1 * | 8/2004 | Osborne ..................... 361/152 |
| 6,992,585 B2 * | 1/2006 | Saleh et al. ................. 340/571 |
| 6,999,857 B1 * | 2/2006 | Kasper et al. ................. 701/1 |
| 2002/0020219 A1 | 2/2002 | DeRoo et al. |
| 2003/0200785 A1 | 10/2003 | Platt |

* cited by examiner

*Primary Examiner*—John Tweel, Jr.
(74) *Attorney, Agent, or Firm*—William E. Powell, III; Curtis B. Brueske

(57) ABSTRACT

According to some embodiments, a Microelectromechanical System (MEMS) sensor includes a sensing portion that generates a mechanical movement in response to a measurand input. The sensor also includes a logic portion to mechanically perform a logic function in response to the movement.

25 Claims, 15 Drawing Sheets

```
┌─────────────────────────────────┐
│  GENERATE MECHANICAL            │
│  MOVEMENT IN A MEMS DEVICE      │
│  IN RESPONSE TO                 │
│  ELECTROMAGNETIC INPUT          │
│                          402    │
└─────────────────────────────────┘
                │
                ▼
┌─────────────────────────────────┐
│  MECHANICALLY PERFORM           │
│  LOGIC FUNCTION IN MEMS         │
│  DEVICE IN RESPONSE TO THE      │
│  MOVEMENT                       │
│                          404    │
└─────────────────────────────────┘
```

FIG. 4

SYSTEMS, APPARATUS, AND METHODS HAVING A MECHANICAL LOGIC FUNCTION IN A MICROELECTROMECHANICAL SYSTEM SENSOR

BACKGROUND

A sensor may be used to determine a measurand, such as an electromagnetic value. For example, a sensor might generate a signal associated with the strength of a magnetic field or an amount of electrical current. Moreover, in some cases logic functions may be performed on the signal generated by the sensor. For example, a signal from a sensor might be electronically processed to detect the presence of a condition, such as an arc fault. Note that a sensor might be used in a "harsh" environment, such as an environment having relatively high temperatures. Unfortunately, electrical devices that are typically used to process sensor signals may not be suitable for such environments.

SUMMARY

According to some embodiments, a Microelectromechanical System (MEMS) sensor includes a sensing portion that generates a mechanical movement in response to a measurand input. The sensor also includes a logic portion to mechanically perform a logic function in response to the movement.

BRIEF DESCRIPTION OF THE DRAWINGS

FIG. 4 illustrates a method according to some embodiments.

DETAILED DESCRIPTION OF EXEMPLARY EMBODIMENTS

Figure 1:
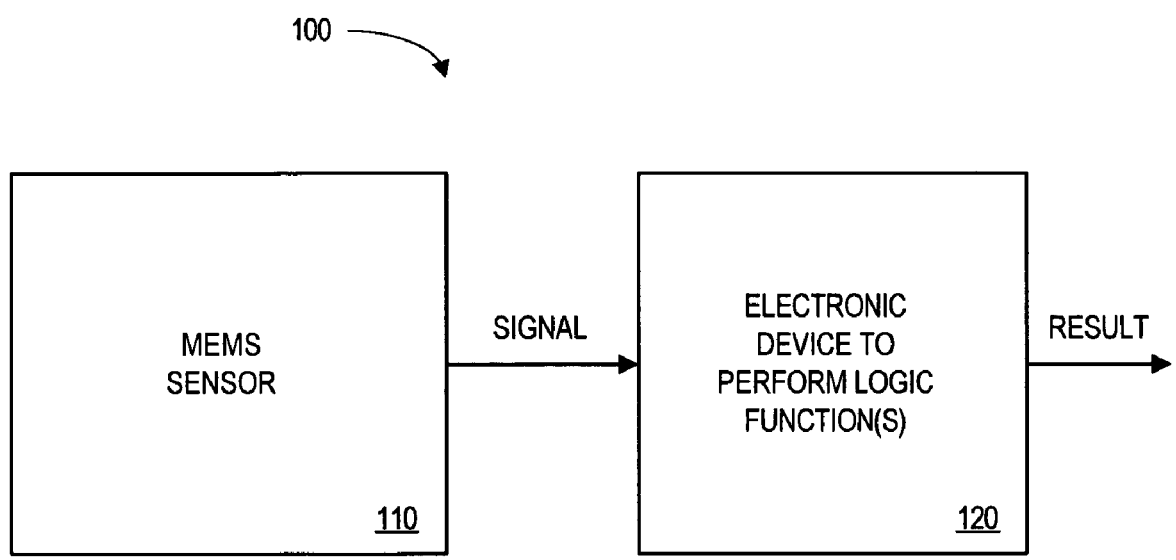
FIG. 1 is a block diagram overview of a sensing system.

A sensor may be used to determine a measurand, such as an electromagnetic value. For example, FIG. 1 is a block diagram overview of a nanotechnology sensing system 100 including a MEMS sensor 110. The MEMS sensor 110 might, for example, output a signal based on a detected magnetic field, magnetic flux, or current value.

In some cases, the one or more logic functions may need to be performed on the signal generated by the MEMS sensor 110. Consider, for example, an "arc fault" detector. An arc fault is an unintended leak of electricity that is flowing through in a circuit. For example, damaged insulation around a wire might let a large amount of current jump or arc to a nearby conductor. Such a condition can be dangerous (e.g., a resulting spark could cause a fire or damage nearby equipment), and therefore an arc fault detector will stop the flow of electricity through the circuit when it is detected.

Figure 2:
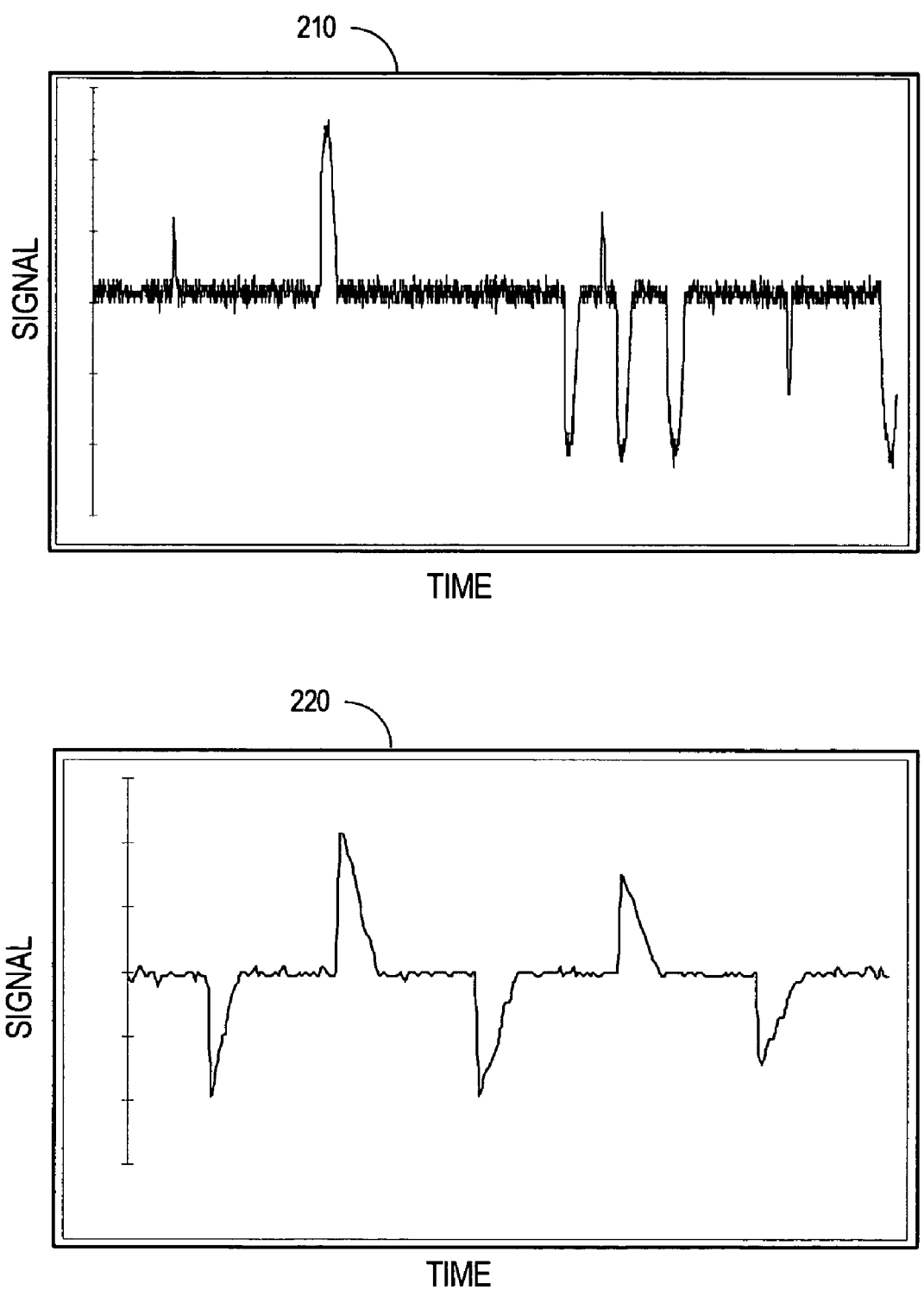
FIG. 2 illustrates a signal that is associated with an arc fault condition and a signal that is not associated with an arc fault condition.

The flow of current through the circuit typically exhibits certain characteristics when an arc fault occurs. For example, FIG. 2 illustrates a signal 210 associated with an arc fault condition. In particular, the series of spikes in the signal 210 may be used to determine if an arc fault is present. Note, however, that a seemingly similar signal can occur even when there is not an arc fault. For example, FIG. 2 illustrates a signal 220 that is not associated with an arc fault (e.g., the signal 220 might be the result of a dimmer switch in the circuit). Thus, an arc fault detector will process the signal from the MEMS sensor 110 to determine if the signal really is associated with an arc fault (to prevent the detector from inadvertently breaking the circuit when there is no arc fault).

Referring again to FIG. 1, the sensing system 100 will typically include an electronic device 120 that performs one or more logic functions to process the signal. The electronic device 120 can then generate a result indicating whether or not an arc fault exists. The logic functions might include determining the absolute value of the signal, determining a frequency associated with the spikes, counting the number of spikes, and comparing the size of a spike to a predetermined threshold value. In some cases a complex algorithm identifies energy that is associated with a relatively high frequency and that rises above a certain threshold. This energy is then integrated over a finite time and the result is compared to another threshold to determine if an arc fault condition exists. In some embodiments, the logic functions might include time measurement, parameterization, and/or Root Mean Square (RMS) detection.

The electronic device 120 may perform these logic functions using transistors, invertors, comparators, and other electrical devices formed of silicon or a similar substance. For example an Application Specific Integrated Circuit (ASIC) device might be designed to process a signal generated by a MEMS sensor. Unfortunately, such devices are generally only useable below a certain temperature (e.g., due to p-n junction leakage and other problems). For example, even a high-temperature electronic device might not be usable above 225° Celsius (C.). Thus, the sensing system 100 might not be practical in some situations (e.g., to sense an arc fault inside or near an aircraft engine) or special steps may need to be taken to package or cool the electrical device 120.

Figure 3:
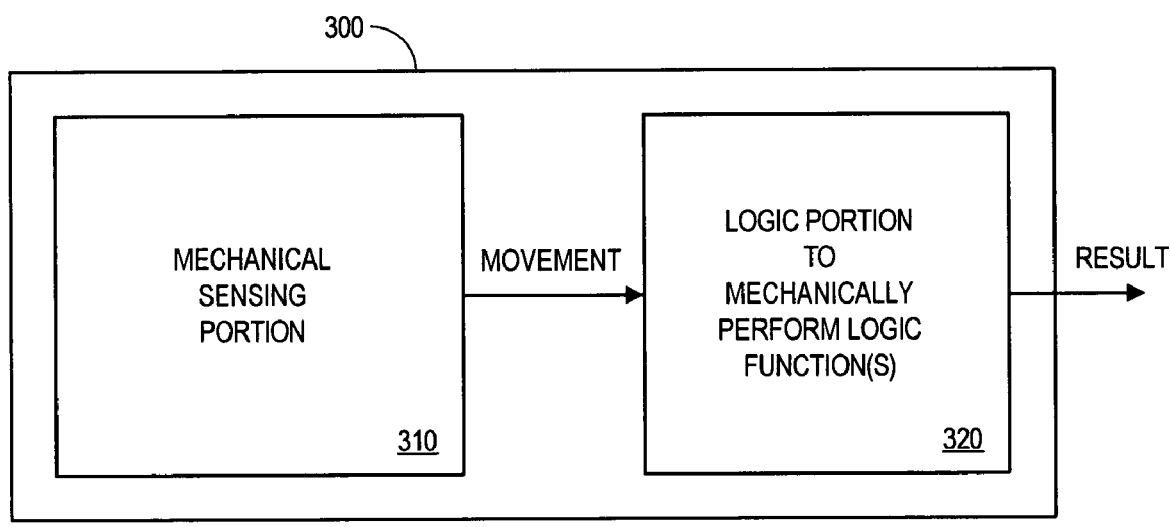
FIG. 3 is a block diagram overview of a MEMS sensor in accordance with an exemplary embodiment of the invention.

Note that the materials used to create a MEMS device (e.g., SiC or ZnO) might be able to withstand higher temperatures as compared to an electrical device. FIG. 3 is a block diagram overview of a MEMS sensor 300 in accordance with an exemplary embodiment of the invention. In this case, the sensor 300 includes a mechanical sensing portion 310 that generates a movement in response to an electromagnetic input. For example, as described with respect to FIGS. 5A and 5B a change in magnetic density, magnetic flux, or a current to be sensed might cause a membrane or other flexible structure to move. In response to the movement, a logic portion 320 mechanically performs one or more logic functions to generate a result. For example, the movement may be measured, translated, recorded, or otherwise processed. Note that the result provided by the logic portion 320 could be mechanical (e.g., a small mirror might be moved to a certain location) or electrical (e.g., a signal output from the MEMS sensor 300 may become high).

FIG. 4 illustrates a method according to some embodiments. The method may, for example, be associated with the MEMS sensor 300. At Step 402, a mechanical movement is generated in response to an electromagnetic input. For example, a change in a magnetic field might cause a suspended beam to rotate. At 404, one or more logic functions are mechanically performed in response to the movement. For example, the angle associated with the beam's movement might be compared to a pre-determined threshold value (e.g., the beam might activate a switch when it rotates more than 10 degrees).

Figure 5A:
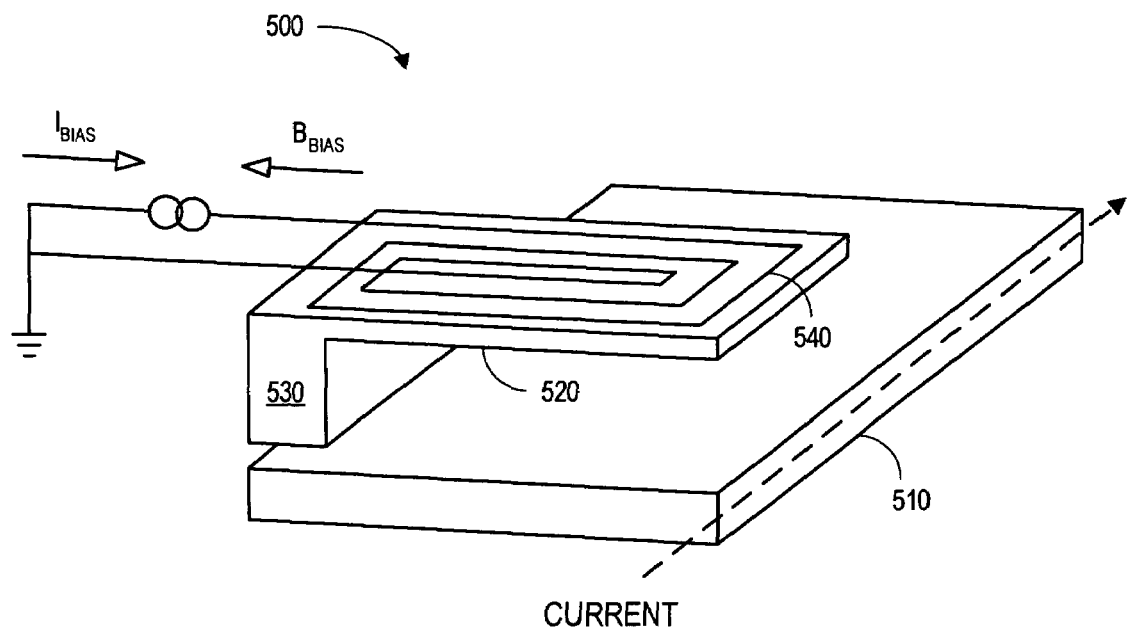
FIG. 5A is a perspective view of a MEMS apparatus constructed in accordance with an exemplary embodiment of the invention.

FIG. 5A is a perspective view of a MEMS apparatus 500 constructed in accordance with an exemplary embodiment of the invention. The apparatus 500 may be, for example, associated with a MEMS arc fault detector. The apparatus 500 includes a substrate 510, such as a copper conductor, through which a current to be sensed can travel. Note that the current to be sensed might travel through a conductive path in or on the substrate 510 (e.g., through a wire) or the substrate 510 itself might be conductive. A flexible structure 520 or plate is suspended above, and substantially parallel to, the substrate 510 via a base 530. In some embodiments, the flexible structure 520 is placed in proximity of the substrate 510 via a base 530 so that the magnetic field created by the current in the substrate 510 is substantially perpendicular to a selected portion of a conductive coil 540 formed on the flexible portion 520.

Figure 5B:
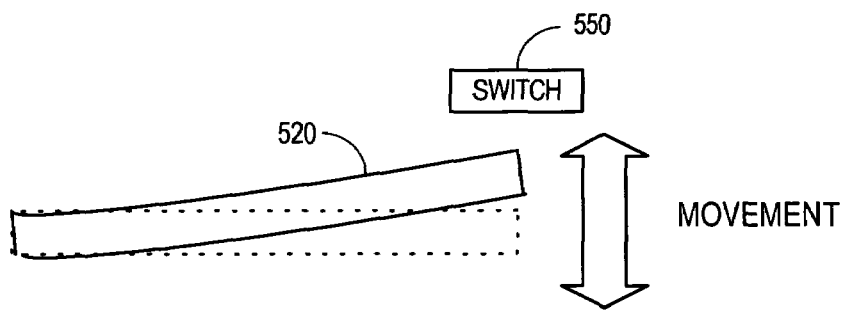
FIG. 5B is a side view of the flexible structure of FIG. 5A.

A conductive coil 540 may be formed on the flexible portion 520. Note that the particular pattern shown for the coil 540 is for illustration only, and that the other dimensions and/or paths of the coil 540 may be used. In fact, some embodiments might simply use a wire instead of a coil. A Direct Current (DC) source is also present such that a bias current ($I_{BIAS}$) will flow through the coil 540. In this way, the current traveling through the substrate 510 will cause the flexible structure 520 to move in a direction normal to the substrate. That is, the Lorentz force associated with the current $I_{BIAS}$ and a magnetic field ($B_{BIAS}$) will cause the flexible structure 520 to deflect upwards or downwards as illustrated in FIG. 5B. Moreover, adjusting current $I_{BIAS}$ may alter the coupling, and therefore the sensitivity, of the device. In some embodiments, an Alternating Current (AC) source may be used to improve the performance of the device.

In addition, the dimensions and materials used to create the flexible structure 520 will determine a resonant frequency. That is, if a series of spikes occur in the current to be sensed substantially at the resonant frequency, the movement of the flexible structure 520 will be increased. Whether or not the flexible structure 520 has moved more than a pre-determined amount might be determined, for example, by placing a switch 550 above the end of the flexible structure 520 that is opposite the base 530.

Note that by selecting appropriate dimensions and materials for the flexible structure 520 and detecting when the flexible structure 520 has moved more that a pre-determined amount, several logic functions have been performed. For example, the logic function of detecting whether or not spikes are occurring at a particular frequency has been performed. Consider again the signals 210, 220 illustrated in FIG. 2. By selecting the right resonant frequency for the flexible structure 520, the MEMS apparatus 500 will be able to distinguish between signals of different frequency content, and this may be used to distinguish between the arc fault signal 210 and the non-arc fault signal 220. Moreover, the logic function is performed mechanically, and the use of temperature-limited electronic devices may be avoided.

Other logic functions are also being performed by the apparatus 500. For example, the absolute value of the current to be sensed may be determined. Moreover, the placement of the switch 550 compares an amount of movement to a pre-determined threshold value.

Figure 6:
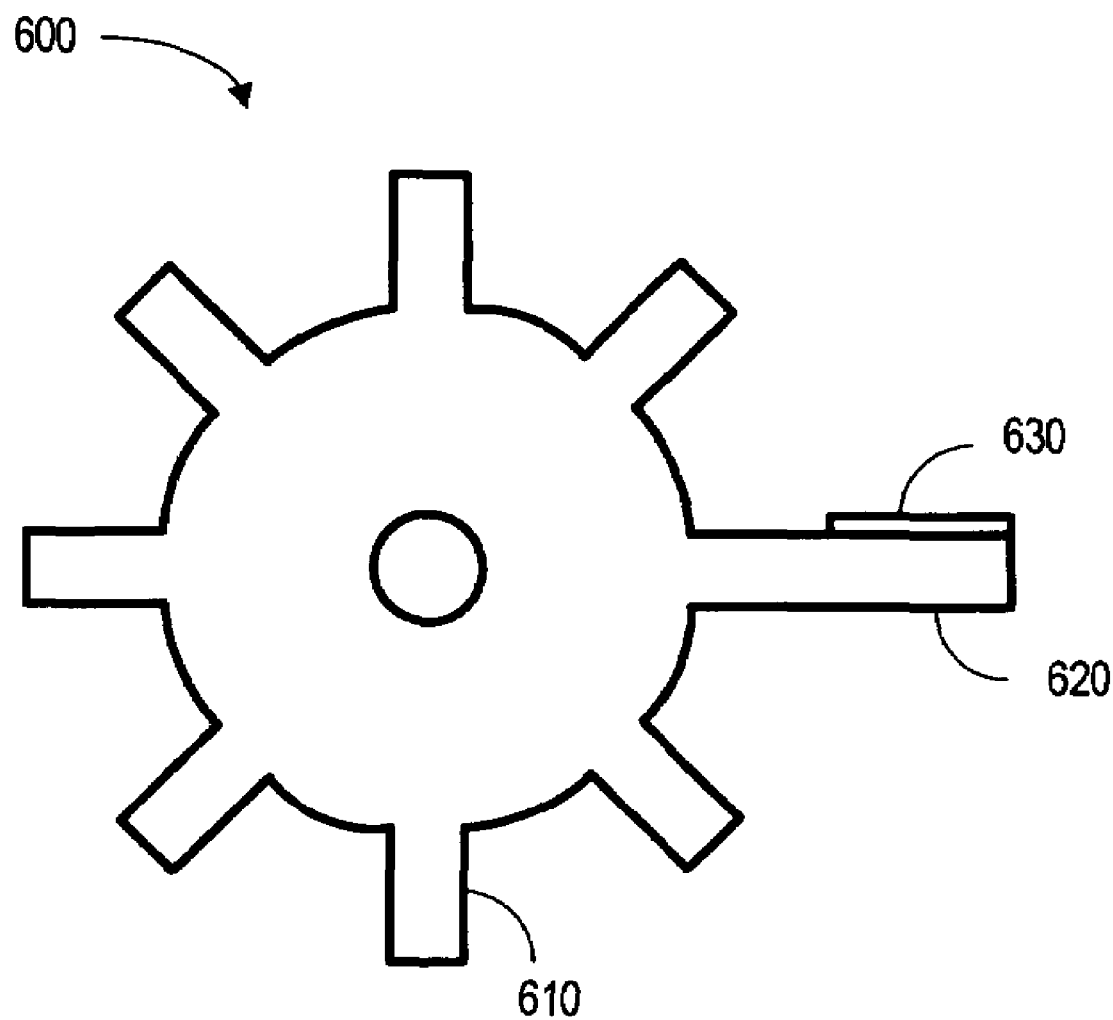
FIG. 6 illustrates an accumulation mechanism in accordance with an exemplary embodiment of the invention.

In some cases, a logic function might accumulate a series of events. For example, a series of three spikes at a certain frequency or a certain frequency content might not necessarily indicate an arc fault condition while a series of six spikes at that frequency would indicate such a condition. FIG. 6 illustrates an accumulation mechanism in accordance with an exemplary embodiment of the invention. In particular, the mechanism is a rotatable gear 600 with eight teeth 610. The gear 600 could be located, for example, in place of the switch 550 such that each time the flexible structure 520 moved more than a pre-determined amount, the end of the flexible structure 520 would contact a tooth 610 and cause the gear 600 to rotate.

According to some embodiments, one or more of the teeth 610 has a distinguishing characteristic. For example, one tooth 620 is longer than the others. In this way, it could be mechanically determined when the gear 600 has been moved a pre-determined number of times (e.g., another switch could be located such that the longer tooth 620 activates the switch after six spikes have been accumulated). Similarly, one tooth could be made shorter than the others. As another approach, a reflective surface 630 or mirror could be provided on the tooth (instead of or addition to making it longer). In this way, it could be optically determined when the gear has been rotated a pre-determined number of times.

Figure 7:
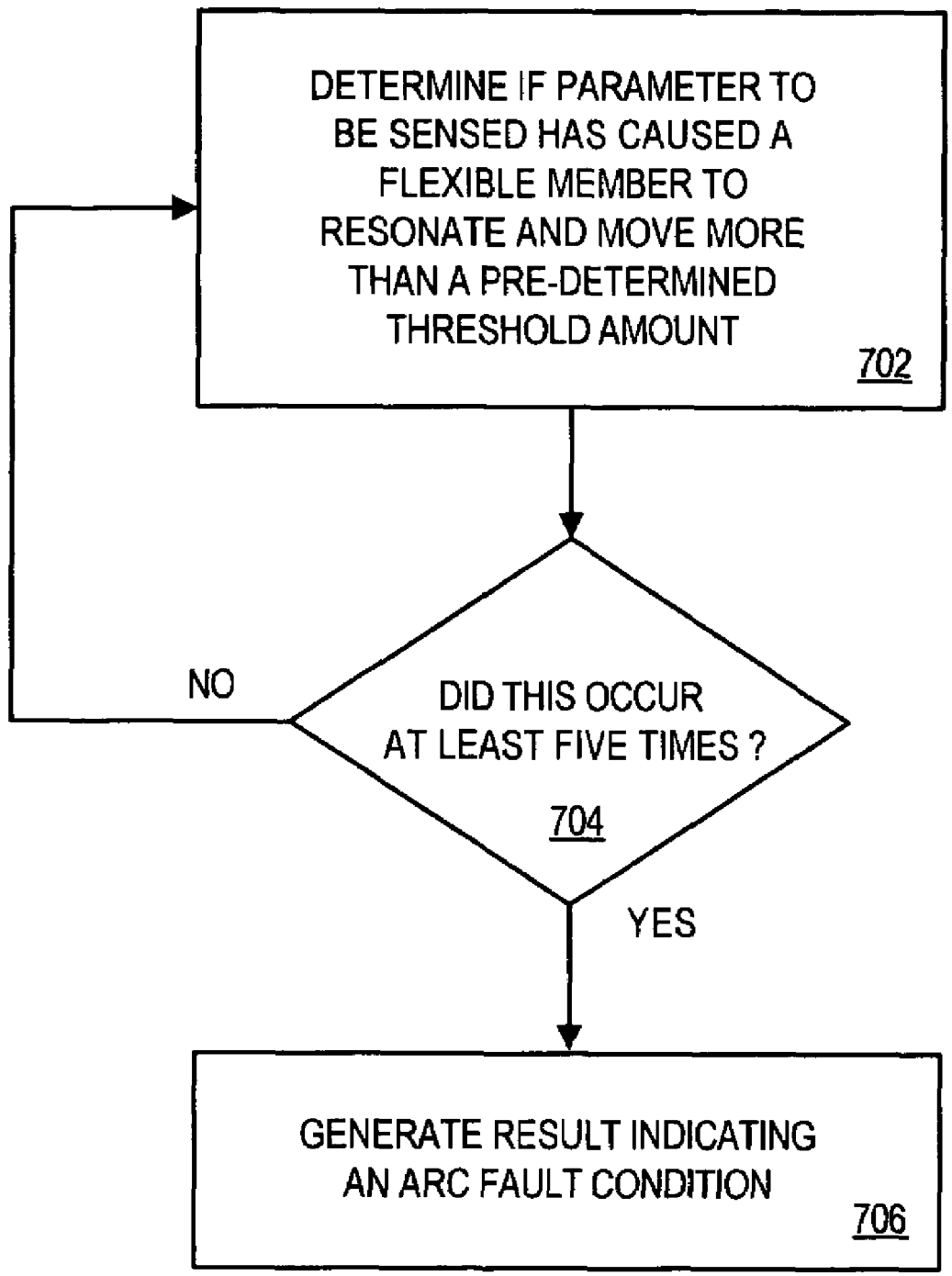
FIG. 7 illustrates a method of detecting arc faults according to some embodiments.

FIG. 7 illustrates a method of detecting arc faults according to such an embodiment. At 702 it is determined whether a parameter to be sensed has caused a flexible member to resonate and move more that a pre-determined threshold amount. If this has not yet occurred at least five times at Step 704, the process continues at Step 702 (e.g., awaiting another occurrence). When it has occurred five times at Step 704, a result is generated at Step 706 indicating that an arc fault condition has occurred. According to some embodiments, the number of occurrences is mechanically reset (e.g., to zero) on a periodic basis.

Although some examples have been described herein with respect to arc fault detection, note that any type of logic functions and/or MEMS sensors might be used in accordance with the present invention. Consider, for example, a device that is used to protect "downstream" components. Such a device might sense the amount of current that is flowing through a wire in order to prevent components in a circuit from overheating (e.g., by turning off the current when too much has flowed through the wire in a short period of time).

Figure 8:
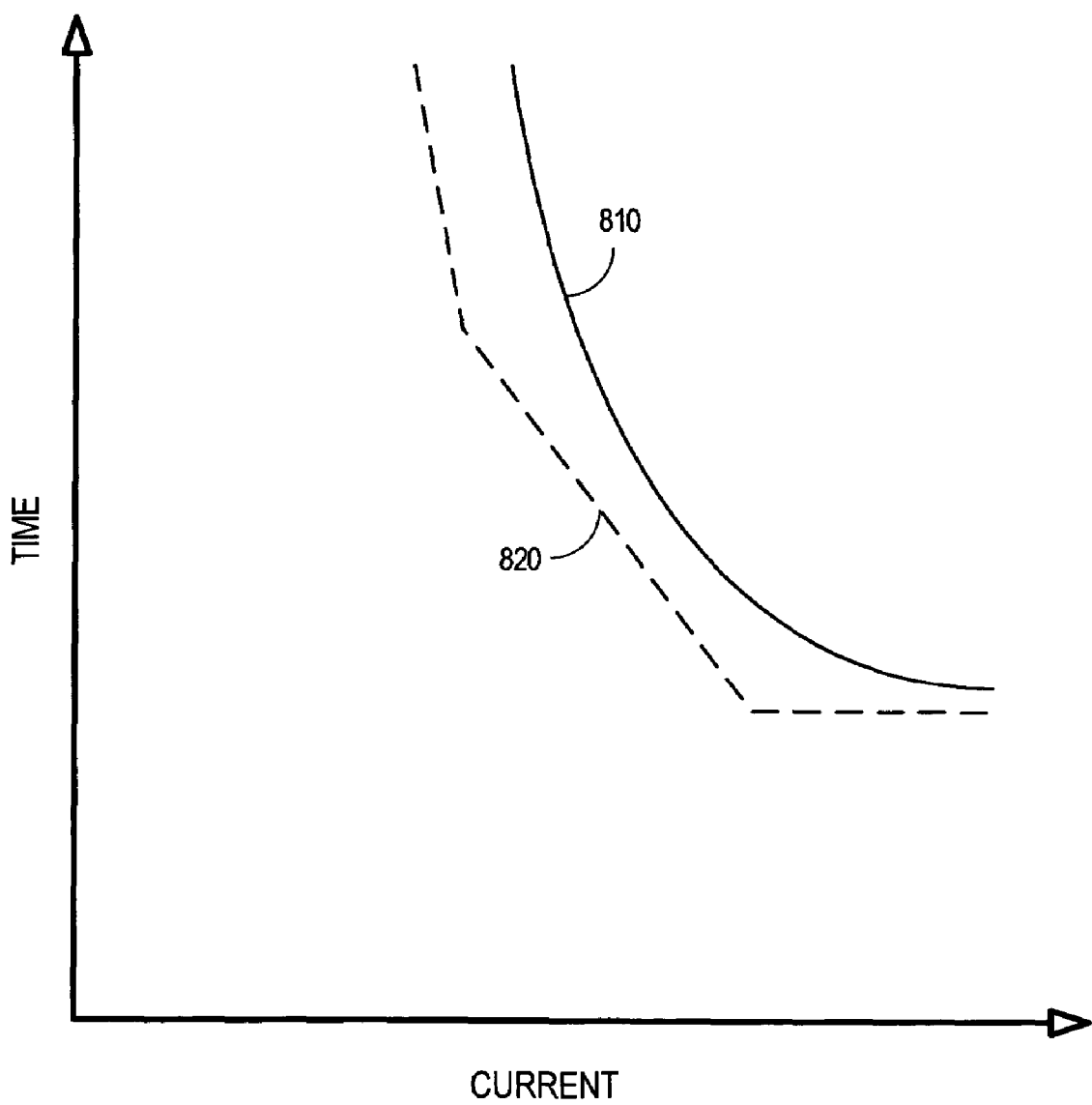
FIG. 8 illustrates how long it might take for a downstream component to become damaged.

FIG. 8 includes a curve 810 that illustrates how long it might take for a downstream component to become damaged. That is, an increase in current flowing through a wire will decrease the amount of time it will take to damage a component. Moreover, when a reduced amount of current flows through the wire the downstream components may begin to cool off. Note that such logic functions are typically performed electronically on a signal associated with the current flow to simulate this type of curve (e.g., as illustrated by the dashed line 820). As before, however, an electrical logic device might not be suitable in all environments.

Figure 9:
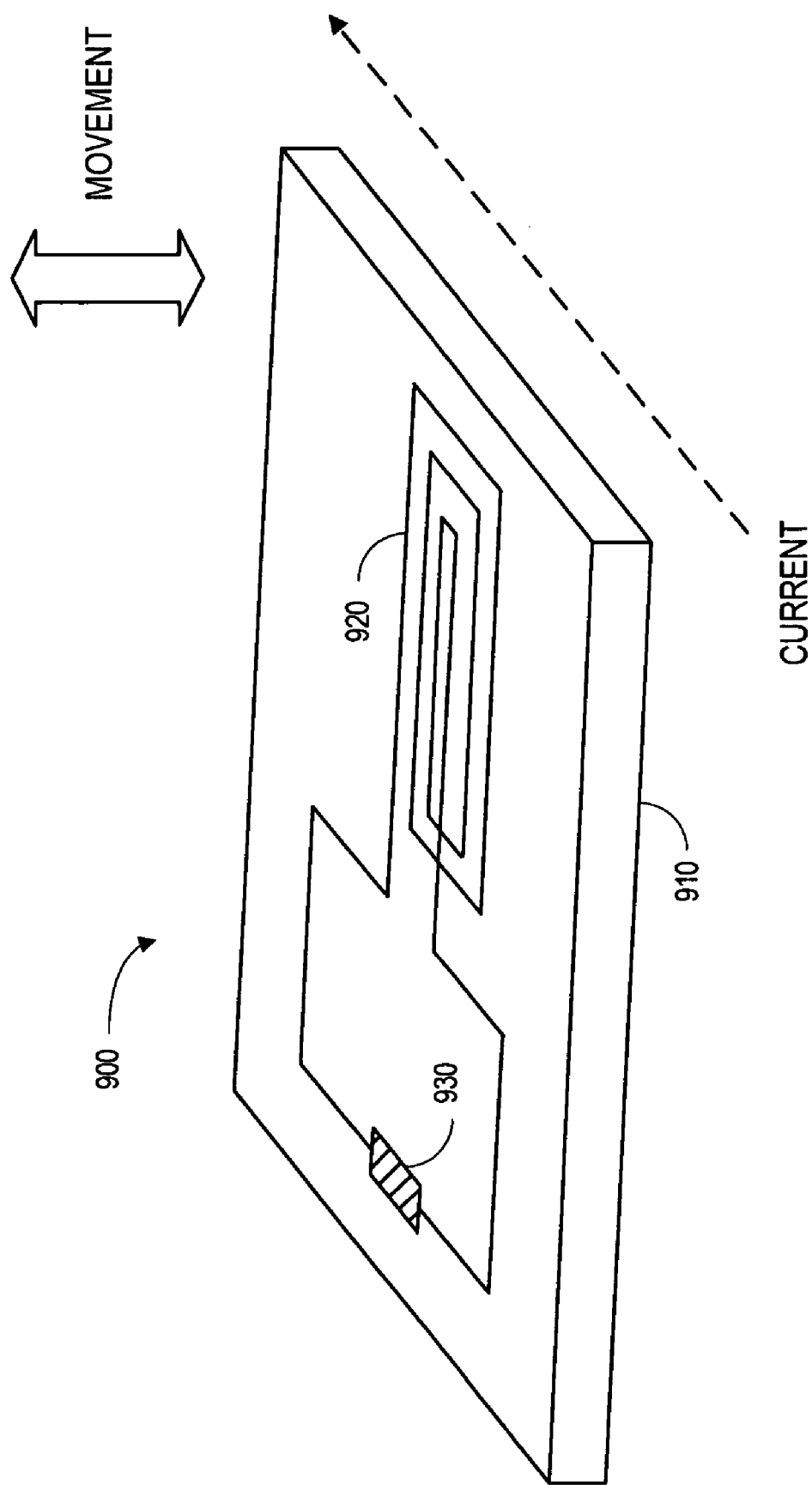
FIG. 9 is a perspective view of a MEMS apparatus constructed in accordance with an exemplary embodiment of the invention.

FIG. 9 is a perspective view of a MEMS apparatus 900 constructed in accordance with an exemplary embodiment of the invention. In this case, a substrate 910 has a circuit including a conductive coil 920 located proximate to a flow of current to be sensed. In addition, the conductive coil 920 and the current to be sensed are galvanometrically coupled such that an induced current flows through the circuit in response to the current to be sensed. Note that the substrate 910 may oscillate up and down in response to an Alternating Current (AC) flow.

Moreover, the circuit includes a circuit breaking portion 930 (e.g., a resistor) that is adapted to open the circuit under a pre-determined condition. Specifically, under certain conditions the induced current will generate enough heat to break the circuit breaking portion 930. In effect, the circuit breaking portion 930 acts a thermo-mechanical emulation of downstream components (components that eventually receive the current that is being sensed). According to another embodiment, the circuit breaking portion 930 is replaced with a resistor that does not break the circuit, but instead only generates heat. In this case, a MEMS heat sensor (not illustrated in FIG. 9) could be placed on or near the resistor to determine when components might become damaged.

Figure 10:
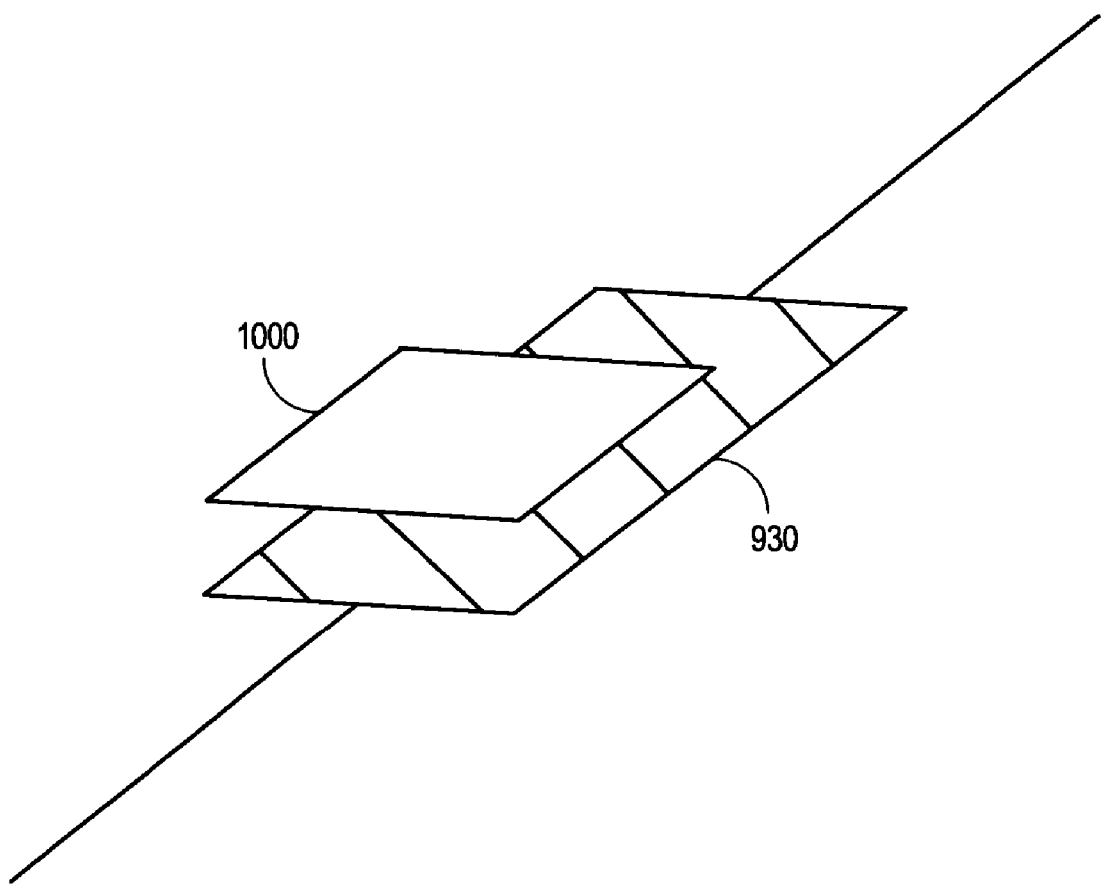
FIG. 10 illustrates a thermal emulation structure in accordance with an exemplary embodiment of the invention.

The geometry of and materials used in the circuit breaking portion 930 (and/or nearby structures) may be selected to accurately simulate the heating and cooling characteristics of downstream components. For example, FIG. 10 illustrates how a cover 1000 may be provided over a portion of the circuit breaking portion 930 in accordance with an exemplary embodiment of the invention. Such a cover 1000 may, for example, make the circuit breaking portion 930 heat up more quickly and cool off more slowly (thus lowering the amount of induced current and/or the duration of the induced current required to break the circuit breaking portion 930).

In this example, the mechanical logic functions associated with the MEMS apparatus 900 might include accumulating an amount of heat associated with downstream components, simulating the cooling characteristics of the downstream components, measuring the duration of the current to be sensed, measuring the amount of current to be sensed, and comparing an amount of heat associated with downstream components to a threshold (e.g., the point at which the circuit breaking portion 930 will break).

Figure 11:
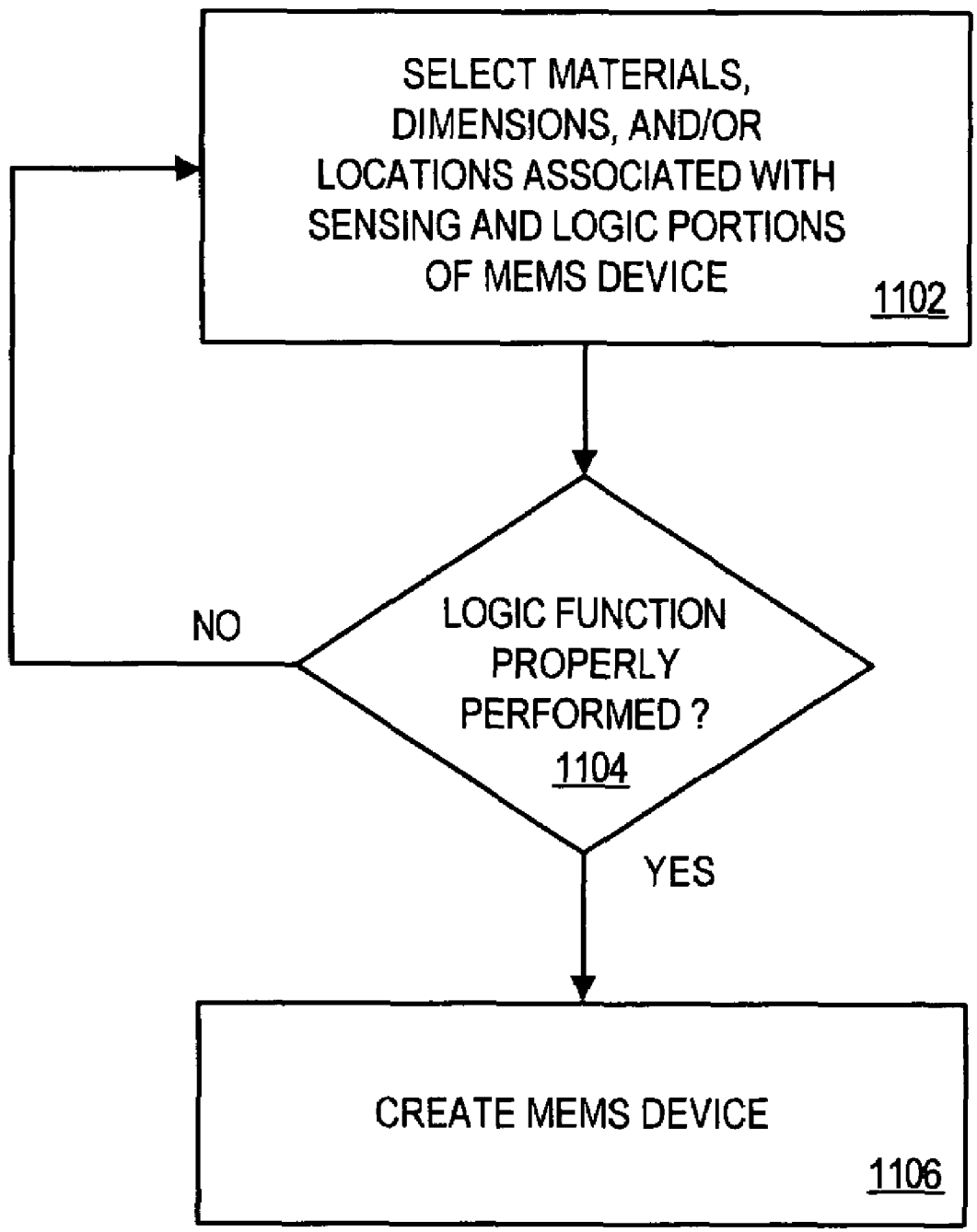
FIG. 11 illustrates a method of designing a mechanical MEMS logic structure according to some embodiments.

Note that the geometry of, and the material used in, the circuit breaking portion 930 will effect the characteristics of the thermal emulation. Similarly, the geometry and materials used with respect to FIG. 5A will effect the characteristics of the arc fault detector (e.g., the flexibility of the structure 520 might determine its resonant frequency and the location of the switch 550 might dictate the amplitude of spikes that are detected). FIG. 11 illustrates a method of designing a mechanical MEMS logic structure according to some embodiments. At Step 1102, the materials, dimensions, and/or locations associated with a sensing portion and a mechanical logic portion of a MEMS device are selected. If the resulting design does not perform the logic function properly at Step 1104 (e.g., as indicated by a simulation or a prototype), Step 1102 is repeated and one or more parameters may be adjusted. If the resulting design does perform the logic function properly at Step 1104, the MEMS device is created at Step 1106. For example, the MEMS device might be lithographically defined.

Figure 12:
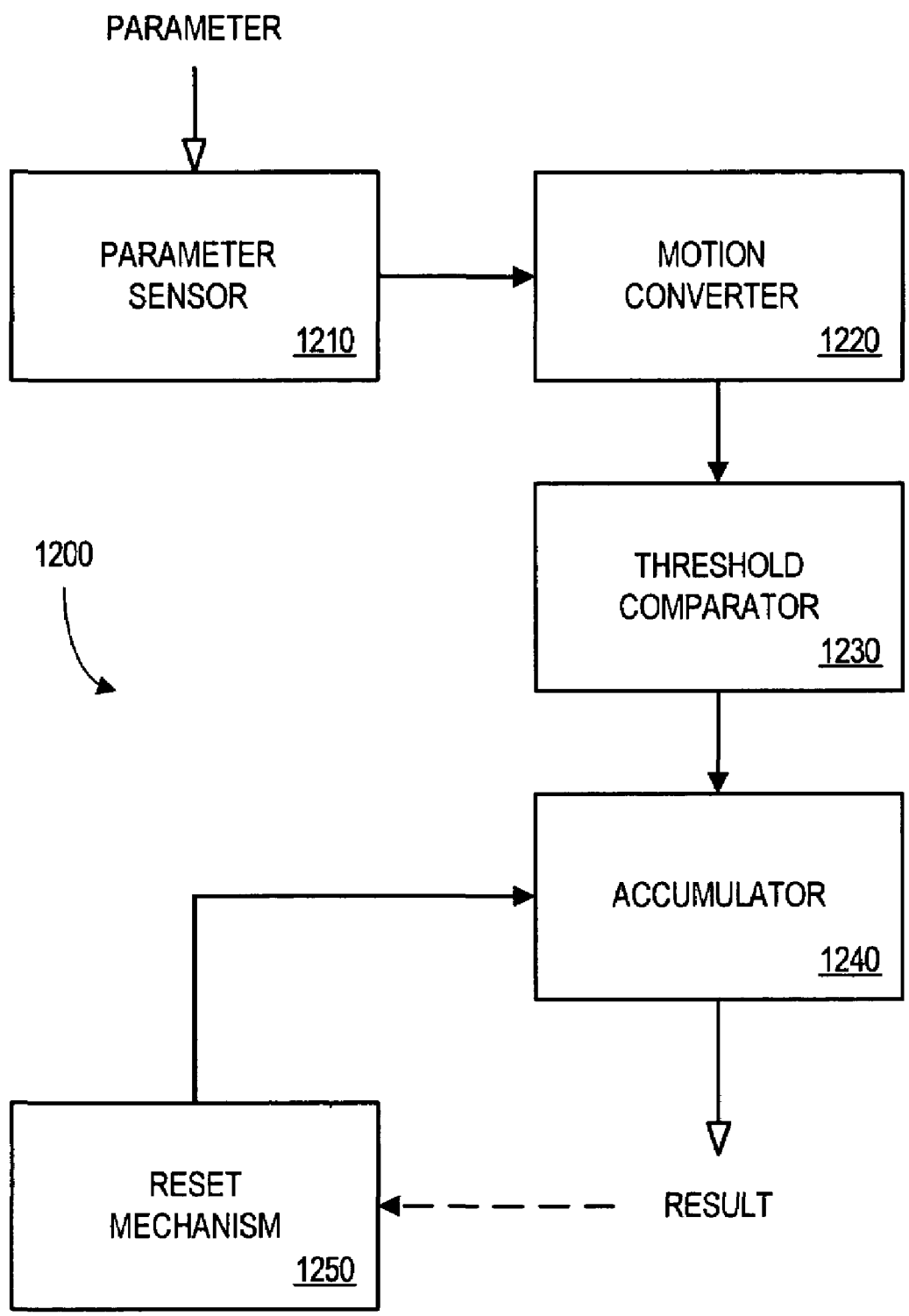
FIG. 12 illustrates a sensor constructed in accordance with an exemplary embodiment of the invention.

FIG. 12 illustrates an example of a MEMS sensor 1200 that may be used to measure a parameter. The parameter might be, for example, an atmospheric pressure. As another example, the parameter might be a stress or strain (e.g., associated with an engine or wing of an airplane). A parameter sensor 1210 detects or is influenced by the parameter, and a motion converter 1220 converts information about the parameter into a movement or motion. For example, an increased amount of pressure might result in a corresponding increase in the motion generated by the motion converter 1220.

A threshold comparator 1230 may mechanically compare the movement to a threshold. For example, the threshold comparator 1230 might determine whether or not the amount of movement exceeds a pre-determined distance. An accumulator 1240 mechanically stores information about the number of times the threshold has been exceeded and provides a result. The result might indicate, for example, that the threshold has been exceeded four times.

A reset mechanism 1250 may also be provided to mechanically clear the information stored by the accumulator 1240. For example, when the result indicates that the threshold has been exceeded six times, the reset mechanism 1250 may arrange for the accumulator to now indicate that the threshold has been exceeded zero times. According to some embodiments, the reset mechanism may be activated by another event (e.g., a reset request received from a device external to the sensor 1200).

Figure 13:
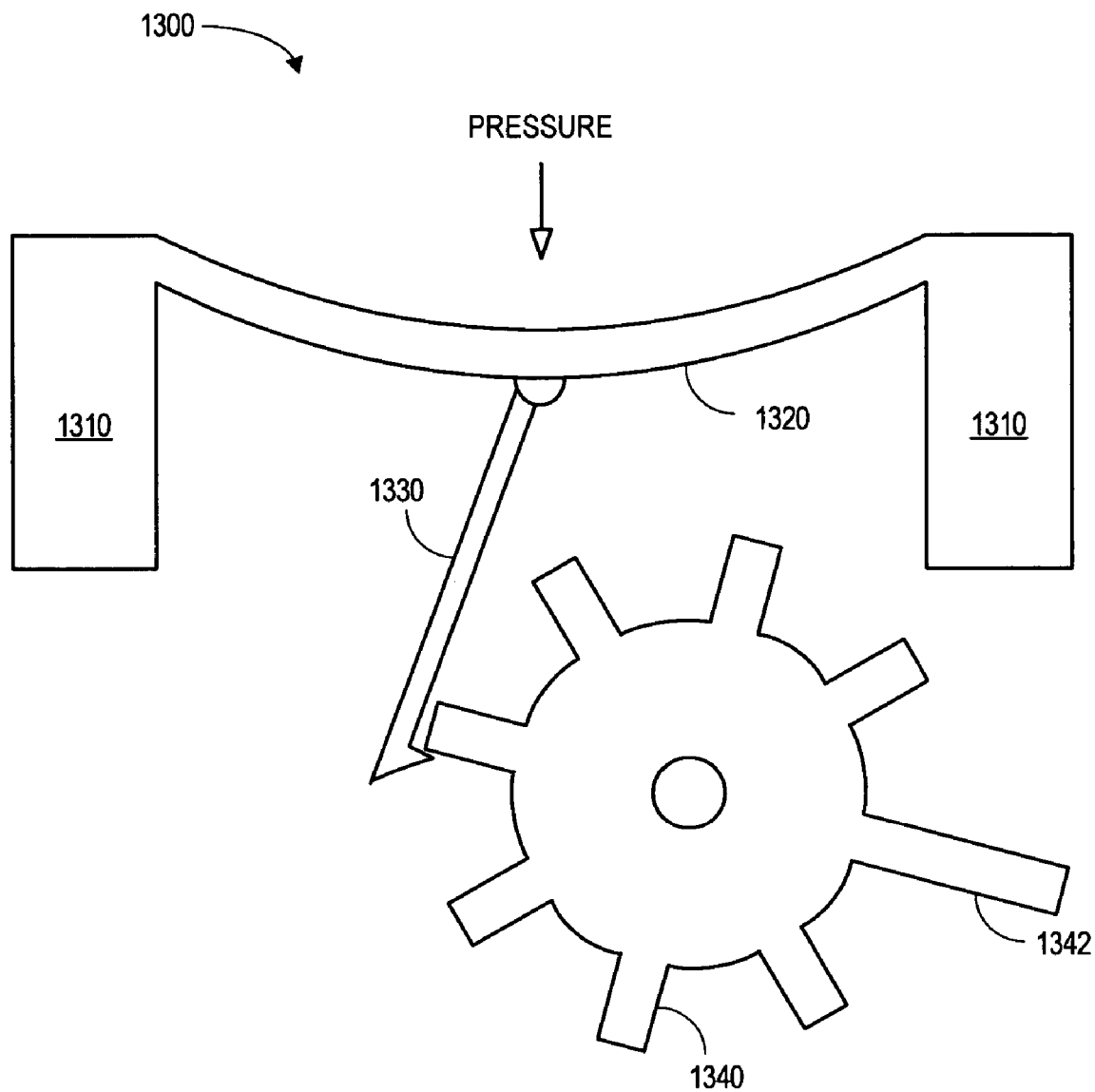
FIG. 13 illustrates one example of a pressure sensor in accordance with an exemplary embodiment of the invention.

FIG. 13 illustrates a MEMS pressure sensor 1300 constructed in accordance with an exemplary embodiment of the invention. The pressure sensor 1300 includes a flexible membrane 1320 supported by anchors 1310. As a result, the membrane 1320 will flex downwards when the pressure above the membrane 1320 exceeds the pressure below the membrane 1320, and the distance of the movement will correspond to the difference between these two pressures. Note that in some embodiments, the area below the membrane 1320 comprises a vacuum.

A lever 1330 attached to bottom of the membrane 1320 will move along with the membrane 1320. Moreover, the lever 1330 may cause a gear 1340 to rotate. For example, as illustrated FIG. 13, the lever 1330 may move upwards and cause the gear 1340 to rotate clockwise when the pressure above the membrane 1320 falls below a particular value (e.g., because the amount of deflection will reduced based on the materials and dimensions associated with the membrane 1320). In addition, one tooth 1342 on the gear is longer than the other teeth. Thus, the position of the longer tooth 1342 may indicate how many times the pressure has fallen below that particular value.

Note that the sensitivity of the sensor 1300 might be adjusted by moving the location of the gear 1340. According to some embodiments, thermal energy may be used along with a shape memory metal alloy support structure to move the gear 1340 (e.g., upwards or downwards) to adjust the sensitivity of the sensor 1300.

Figure 14:
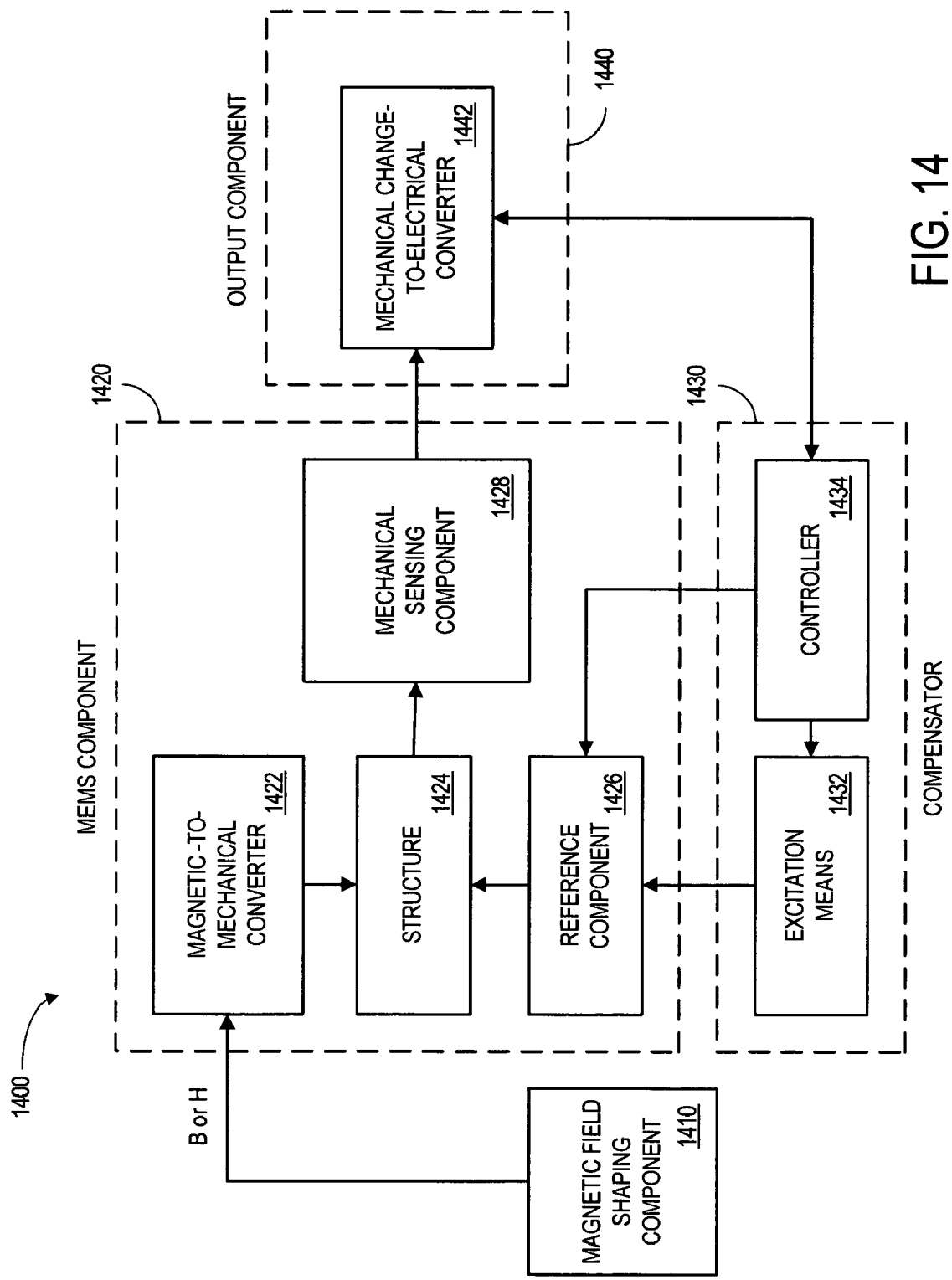
FIG. 14 is a block diagram overview of a sensing system according to some embodiments.

FIG. 14 is a block diagram overview of a sensing system 1400 according to some embodiments. The system 1400 includes a magnetic field shaping component that results in a magnetic flux density (B) or field (H) being provided to a MEMS component 1420. In particular, a magnetic-to-mechanical converter 1422 may move a structure 1424 in response to the magnetic flux density or field. A mechanical sensing component 1428 can then generate a mechanical result based on the movement of the structure 1424 and a reference component 1426. According to some embodiments, a controller 1434 (e.g., associated with a compensator 1430) may use excitation means 1432 to influence the reference component 1426. The mechanical result from the mechanical sensing component 1428 may then be provided to, for example, a mechanical change-to-electrical converter 1442 associated with an output component 1440 or stage.

The following illustrates various additional embodiments of the present invention. These do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

Figure 15:
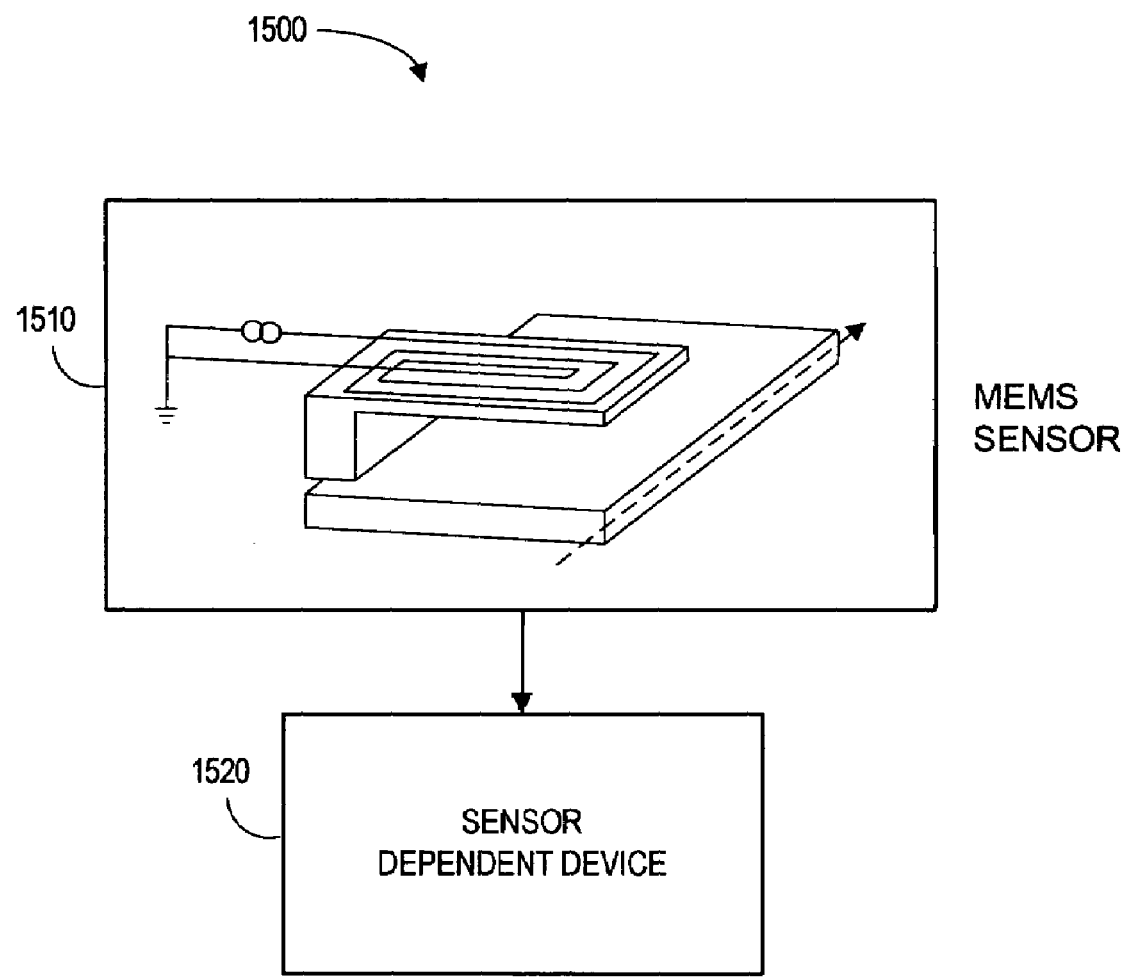
FIG. 15 is a system constructed in accordance with another exemplary embodiment of the invention.

For example, a MEMS sensor could be associated with a system 1500 such as the one illustrated in FIG. 15. The system 1500 includes a MEMS sensor 1510 that operates in accordance with any of the embodiments described herein. For example, the MEMS sensor 1510 might include (i) a sensing portion to generate a mechanical movement in response to an electromagnetic input and (ii) a logic portion to mechanically perform a logic function in response to the movement.

Information from the MEMS sensor 1510 is provided to a sensor dependent device 1520 (e.g., via an electrical signal). The MEMS sensor 1510 might be associated with, for example, an arc fault detector, a device to protect downstream components, a security device, a medical device, an electrical controller, a power distribution device, a power meter, a circuit breaker, a consumer device, or a motor control device.

In addition, although some embodiments have been described with respect to particular logic functions, embodiments may mechanically perform any type of logic function. For example, a lever and a fulcrum might be used to multiply (or divide) one amount of movement as compared to another amount of movement. As another example, two movements could be added to (or subtracted from) each other or compared to each other. Similarly, two or more movements might be combined via a Boolean AND function (e.g., all movements are required to activate a switch) or a Boolean OR function (e.g., any of the movements will activate a switch). As still another example, a first movement could allow (or prevent) a second movement from occurring.

Moreover, although particular layouts have been described herein, embodiments may be associated with other layouts. For example, flexible structure 520 of FIG. 5A could be suspended over a well formed in or on the substrate 510 (e.g., by being etched into a layer of oxide) and may include a membrane, a cantilever, a deflectable membrane, a diaphragm, a flexible member, a cavity, a surface micromachined structure, a bulk micro-machined structure, a comb structure, and/or a bridge.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed:

1. A microelectromechanical system sensor, comprising:
    a flexible structure, having a conductive coil wherein a bias current is to be provided through the conductive coil, to generate a mechanical movement in response to at least one of: (i) an electromagnetic input, (ii) a magnetic field, (iii) a magnetic flux, or (iv) a pressure; and
    a logic portion to mechanically perform a logic function in response to the movement.

2. The sensor of claim 1, wherein the flexible structure has a geometric relationship with a substrate such that a current traveling through the substrate will cause the flexible structure to move.

3. The sensor of claim 2, wherein the logic function comprises detection of whether an absolute value of a signal substantially matches a pre-determined frequency range.

4. The sensor of claim 3, wherein the logic portion comprises a first logic portion, and further comprising:
    a second logic portion to accumulate a number of times that resonance caused the flexible structure to move more than a threshold amount.

5. The sensor of claim 4, wherein the second logic portion comprises a rotatable element.

6. The sensor of claim 5, wherein the rotatable element comprises a gear with teeth, at least one tooth having a distinguishing characteristic.

7. The sensor of claim 3, wherein the logic function is associated with at least one of: (i) detection of a signal having a pre-determined frequency content, (ii) an absolute value calculation, (iii) an accumulation, or (iv) a comparison to a threshold.

8. The sensor of claim 3, wherein the sensor is to detect an arc fault condition.

9. A microelectromechanical system sensor, comprising:
    a sensing portion to generate a mechanical movement in response to a current to be sensed; and
    a logic portion to mechanically perform a logic function in response to the movement.

10. The sensor of claim 9, wherein the sensing portion comprises a conductive coil located proximate to a conductor through which the current to be sensed flows.

11. The sensor of claim 10, wherein the conductive coil and the current to be sensed are galvanometrically coupled such that an induced current flows through a circuit including the conductive coil in response to the current to be sensed.

12. The sensor of claim 9, wherein the logic portion includes a circuit breaking portion adapted to open the circuit under a pre-determined condition.

13. The sensor of claim 12, wherein the logic function comprises a thermal emulation.

14. The sensor of claim 13, wherein the thermal emulation is associated with at least one of: (i) heat accumulation, (ii) heat dissipation, (iii) duration, (iv) amplitude, or (v) comparison to a threshold.

15. The sensor of claim 13, wherein the sensor is to protect a downstream component that receives the current to be sensed.

16. The sensor of claim 9, wherein the logic function is associated with at least one of: (i) detection of a signal having a pre-determined frequency content, (ii) an absolute value calculation, (iii) an accumulation, (iv) a comparison to a threshold, (v) heating, (vi) cooling, (vii) a duration, or (viii) an amplitude calculation.

17. The sensor of claim 9, wherein the wherein the logic portion generates a mechanical result.

18. A microelectromechanical arc fault detector, comprising:
   a substrate through which a current is to travel;
   a flexible structure having a conducing coil through which a bias current is to be provided, wherein the flexible structure has a geometric relationship with the substrate such that the current traveling through the substrate will cause the flexible structure to move; and
   a rotatable element to accumulate a number of times the flexible structure moves more than a threshold amount, wherein the flexible structure will move more than the threshold amount if a frequency content associated with the current traveling through the substrate substantially matches a pre-determined frequency content.

19. A microelectromechanical sensor to protect a downstream component, comprising:
   a conductive coil galvanometrically coupled to a current to be sensed such that an induced current flows through a circuit including the conductive coil in response to the current to be sensed; and
   a circuit breaking portion in the circuit adapted to open the circuit under a pre-determined condition, wherein the pre-determined condition is associated with a thermal emulation of the downstream component.

20. A method of sensing a current, comprising:
   generating a mechanical movement in a microelectromechanical system apparatus in response to the measurand current; and
   mechanically performing a logic function in the apparatus in response to the movement.

21. A system, comprising:
   a microelectromechanical system sensor, including:
      a sensing portion to generate a mechanical movement in response to a current, and
      a logic portion to mechanically perform a logic function in response to the movement; and
   a sensor dependent device.

22. The system of claim 21, wherein the sensor dependent device is associated with at least one of: (i) a security device, (ii) a medical device, (iii) an electrical controller, (iv) a power distribution device, (v) a power meter, (vi) a circuit breaker, (vii) a consumer device, or (viii) a motor control device.

23. A microelectromechanical system sensor, comprising:
   an electrical sensing portion to generate a mechanical movement in response to an electrical input; and
   a logic portion to mechanically perform a logic function in response to the movement.

24. The sensor of claim 23, wherein the electrical sensing portion includes a conductive coil located proximate to a conductor trough which a current to be measured flows.

25. The sensor of claim 23, where the logic portion is to mechanically store information.

* * * * *